(12) United States Patent
Zhang et al.

(10) Patent No.: US 11,349,093 B2
(45) Date of Patent: May 31, 2022

(54) ORGANIC ELECTROLUMINESCENT DEVICE AND DISPLAY APPARATUS

(71) Applicant: KUNSHAN GO-VISIONOX OPTO-ELECTRONICS CO., LTD., Kunshan (CN)

(72) Inventors: Xiaozhen Zhang, Kunshan (CN); Lin He, Kunshan (CN); Wenkai Chen, Kunshan (CN)

(73) Assignee: KUNSHAN GO-VISIONOX OPTO-ELECTRONICS CO., LTD., Kunshan (CN)

(*) Notice: Subject to any disclaimer, the term of this patent is extended or adjusted under 35 U.S.C. 154(b) by 631 days.

(21) Appl. No.: 16/330,182

(22) PCT Filed: Apr. 28, 2018

(86) PCT No.: PCT/CN2018/085017
§ 371 (c)(1),
(2) Date: Mar. 4, 2019

(87) PCT Pub. No.: WO2019/041862
PCT Pub. Date: Mar. 7, 2019

(65) Prior Publication Data
US 2021/0351370 A1    Nov. 11, 2021

(30) Foreign Application Priority Data
Aug. 31, 2017  (CN) .......................... 201710775994.8

(51) Int. Cl.
*H01L 51/50*   (2006.01)
*H01L 27/32*   (2006.01)
*H01L 51/00*   (2006.01)

(52) U.S. Cl.
CPC ...... *H01L 51/5004* (2013.01); *H01L 27/3211* (2013.01); *H01L 51/006* (2013.01);
(Continued)

(58) Field of Classification Search
CPC combination set(s) only.
See application file for complete search history.

(56) References Cited

U.S. PATENT DOCUMENTS 10,069,096 B1 * 9/2018  Xu ..................... H01L 51/5012
2004/0048101 A1 * 3/2004  Thompson ............ C09K 11/06
313/506

(Continued)

FOREIGN PATENT DOCUMENTS

CN    101688114 A    3/2010
CN    102738400 A    10/2012
(Continued)

OTHER PUBLICATIONS

Chinese Office Action dated Sep. 3, 2019, in connection with corresponding CN Application 201710775994.8 (8 pgs., including machine-generated English translation).

(Continued)

*Primary Examiner* — Moin M Rahman
*Assistant Examiner* — Mohammad A Rahman
(74) *Attorney, Agent, or Firm* — Maier & Maier, PLLC

(57) ABSTRACT

The present application provides an organic electroluminescent device and a display apparatus. The organic electroluminescent device includes a first conductive layer group, a second conductive layer group, and a light emitting layer disposed between the first conductive layer group and the second conductive layer group and in ohmic contact with the two groups. The first conductive layer group includes an electron blocking layer in ohmic contact with the light emitting layer, and a hole transport layer in ohmic contact with the electron blocking layer. The HOMO energy level of the electron blocking layer is between that of the hole transport layer and that of the light emitting layer, and the LUMO energy level of the electron blocking layer is shal- (Continued)

lower than that of the hole transport layer and that of the light emitting layer.

17 Claims, 2 Drawing Sheets

(52) U.S. Cl.
CPC ...... *H01L 51/5012* (2013.01); *H01L 51/5016* (2013.01); *H01L 51/5056* (2013.01); *H01L 51/5096* (2013.01); *H01L 51/0058* (2013.01); *H01L 2251/552* (2013.01); *H01L 2251/558* (2013.01)

(56) References Cited

U.S. PATENT DOCUMENTS

| | | | |
|---|---|---|---|
| 2009/0191427 | A1 | 7/2009 | Liao et al. |
| 2013/0114269 | A1* | 5/2013 | Domercq ............ H01L 51/5215 362/311.05 |
| 2014/0191206 | A1 | 7/2014 | Cho |
| 2016/0093813 | A1 | 3/2016 | Stoessel et al. |
| 2016/0226011 | A1* | 8/2016 | Nazeeruddin ....... H01L 51/4213 |
| 2016/0248030 | A1 | 8/2016 | Zhang |
| 2017/0033301 | A1 | 2/2017 | Han et al. |
| 2017/0317290 | A1* | 11/2017 | Lee ...................... C07D 209/86 |
| 2018/0006245 | A1* | 1/2018 | Pfister ................ H01L 51/0061 |
| 2018/0354931 | A1* | 12/2018 | He ....................... C07D 401/14 |
| 2018/0358577 | A1* | 12/2018 | Inoue ................. H01L 51/5234 |

FOREIGN PATENT DOCUMENTS

| | | |
|---|---|---|
| CN | 103227294 A | 7/2013 |
| CN | 103715360 A | 4/2014 |
| CN | 104183712 A | 12/2014 |
| CN | 104241540 A | 12/2014 |
| CN | 104934544 A | 9/2015 |
| CN | 105206715 A | 12/2015 |
| CN | 105244446 A | 1/2016 |
| EP | 2 629 346 A2 | 8/2013 |
| JP | 2002175887 A | 6/2002 |
| JP | 2007059687 A | 3/2007 |
| JP | 2007227431 A | 9/2007 |
| JP | 2013168649 A | 8/2013 |
| KR | 20090014373 A | 2/2009 |
| TW | 200940512 A | 10/2009 |
| TW | 201506124 A | 2/2015 |
| WO | 2012136295 A1 | 10/2012 |
| WO | 2017016632 A1 | 2/2017 |

OTHER PUBLICATIONS

International Search Report dated Jul. 25, 2018 in corresponding International application No. PCT/CN2018/085017; 3 pages.
European Extended Search Report dated Sep. 25, 2020, in connection with corresponding EP Application No. 18850258.7; 9 pages.
Japanese Office Action dated Oct. 27, 2020, in connection with corresponding JP Application No. 2019-55476 (10 pp., including machine-generated English translation).
Korean Office Action dated Oct. 30, 2020, in connection with corresponding KR Application No. 10-2019-7027918 (9 pp., including machine-generated English translation).

* cited by examiner

ORGANIC ELECTROLUMINESCENT DEVICE AND DISPLAY APPARATUS

CROSS-REFERENCE TO RELATED APPLICATION

The application claims the benefit of priority of Chinese Patent Application No. 201710775994.8, filed on Aug. 31, 2017, and the entire disclosures of which are incorporated herein.

TECHNICAL FIELD

The present application relates to the field of flat panel display, and in particular, to an organic electroluminescent device and a display apparatus.

BACKGROUND

An Organic Electroluminescent Device is a light-emitting device using an organic solid-state semiconductor as a light-emitting material. Due to the advantages of having a simple preparation process, low cost, low power consumption, high brightness, a wide range of operation temperature and so on, the organic electroluminescent device has a broad application prospect.

The structure of an existing organic electroluminescent device generally includes an anode layer, a cathode layer, and a light emitting layer disposed between the anode layer and the cathode layer. A hole transport layer and a hole injection layer are further provided between the light emitting layer and the anode layer. An electron transport layer and an electron injection layer are further provided between the light emitting layer and the cathode layer. Under the effect of an external electric field applied on the organic electroluminescent device, electrons and holes are injected into the light emitting layer from the cathode and the anode respectively and then move, recombine, and decay in the light emitting layer, to realize light emission.

The light emitting layer generally includes a red sub-pixel light emitting layer, a green sub-pixel light emitting layer, and a blue sub-pixel light emitting layer. The lifespan of the red sub-pixel light emitting layer is superior while the lifespan of the green and blue sub-pixel light emitting layers is poor, which results in a shift of white light chromaticity coordinates after an organic electroluminescent device display panel is used for a period. Thus, the organic electroluminescent device display quality is affected, and the application of the organic electroluminescent device in the field requiring a long lifespan is restricted.

Therefore, it is an urgent problem to be solved by those skilled in the art to prolong the lifespan of the green sub-pixel light emitting layer and the blue sub-pixel light emitting layer.

SUMMARY

It is an object of the present application to provide an organic electroluminescent device and a display apparatus to prolong the device lifespan and guarantee the product performance.

To achieve the foregoing object, the present application provides an organic electroluminescent device, which includes a first conductive layer group, a second conductive layer group, and a light emitting layer disposed between the first conductive layer group and the second conductive layer group and in ohmic contacts with the two groups, wherein the first conductive layer group includes an electron blocking layer in ohmic contact with the light emitting layer, and a hole transport layer in ohmic contact with the electron blocking layer. The HOMO energy level of the electron blocking layer is between that of the hole transport layer and that of the light emitting layer, and the LUMO energy level of the electron blocking layer is shallower than that of the hole transport layer and that of the light emitting layer.

Optionally, the HOMO energy level of the hole transport layer is equal to or shallower than that of the light emitting layer, and the LUMO energy level of the hole transport layer is equal to or shallower than that of the light emitting layer.

Optionally, an energy level difference for the hole transport layer ranges from 2.7 eV to 3.5 eV, an energy level difference for the host material of the light emitting layer ranges from 2.7 eV to 3.4 eV, the HOMO energy level of the electron blocking layer ranges from 5.2 eV to 5.5 eV, the LUMO energy level of the electron blocking layer ranges from 1.9 eV to 2.1 eV and an energy level difference between the HOMO energy level and the LUMO energy level of the electron blocking layer is greater than 3.2 eV.

Optionally, the light emitting layer includes a blue sub-pixel light emitting layer which is made of a fluorescent material, and the electron blocking layer located below the blue sub-pixel light emitting layer is made of a material having a structure of a single aromatic amine containing a spirofluorene group.

Optionally, a structural formula of the structure of a single aromatic amine is one or more selected from the group consisting of:

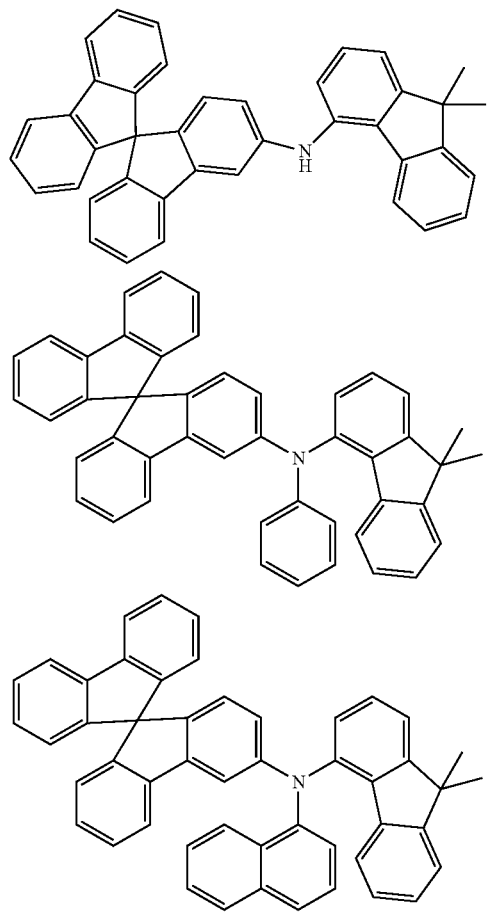

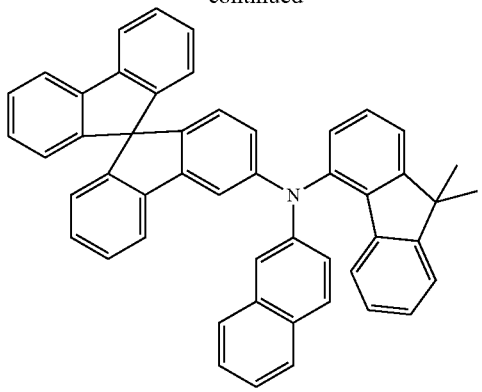

Optionally, an energy level difference for the hole transport layer ranges from 2.7 eV to 3.5 eV, an energy level difference for the host material of the light emitting layer ranges from 2.8 eV to 3.5 eV, the HOMO energy level of the electron blocking layer ranges from 5.2 eV to 5.5 eV, the LUMO energy level of the electron blocking layer ranges from 1.8 eV to 2.0 eV, and an energy level difference between the HOMO energy level and the LUMO energy level of the electron blocking layer is greater than 3.2 eV.

Optionally, the light emitting layer includes a green sub-pixel light emitting layer which is made of a bipolar phosphorescent material, and the electron blocking layer located below the green sub-pixel light emitting layer is made of a material having a structure of a single aromatic amine containing a spirocyclic unit.

Optionally, a structural formula of the structure of a single aromatic amine is one or more selected from the group consisting of:

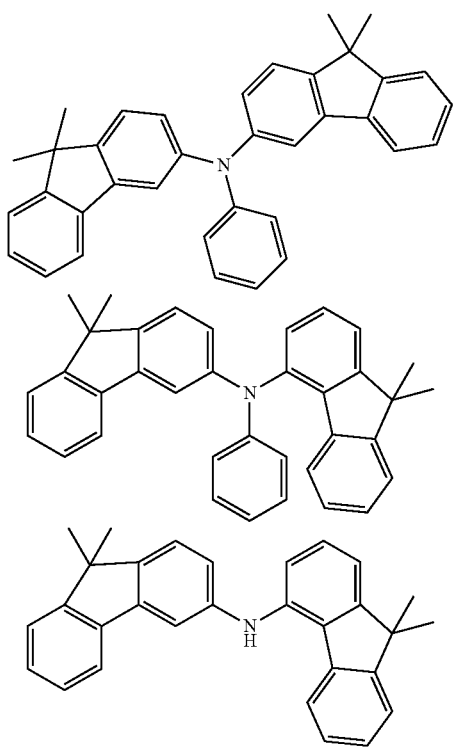

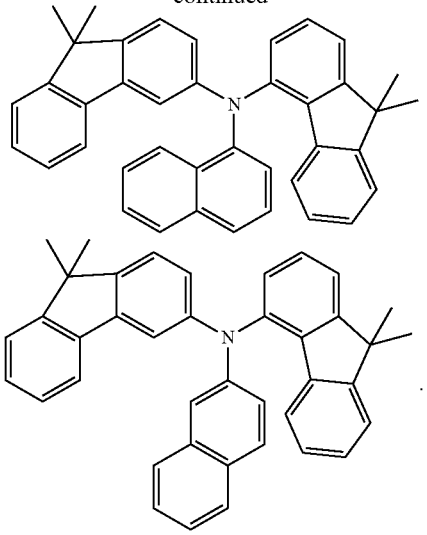

Optionally, the light emitting layer includes a blue sub-pixel light emitting layer and a green sub-pixel light emitting layer, the electron blocking layer located below the blue sub-pixel light emitting layer has a thickness of 50 Å to 100 Å, the electron blocking layer located below the green sub-pixel light emitting layer has a thickness of 100 Å to 400 Å, and the hole blocking layer located above the green sub-pixel light emitting layer in the second conductive layer group has a thickness of 50 Å to 100 Å.

Optionally, the first conductive layer group further includes a first electrode, a hole injection layer, a hole transport layer, and an electron blocking layer which are successively formed.

Optionally, the first electrode is an anode layer.

Optionally, the second conductive layer group includes a second electrode, an electron injection layer, an electron transport layer, and a hole blocking layer which are successively formed.

Optionally, the second electrode is a cathode layer.

Accordingly, the present application also provides a display apparatus comprising a substrate, and the above-described organic electroluminescent device formed on the substrate.

Compared with the prior art, in the organic electroluminescent device and the display apparatus provided by the present application, the organic electroluminescent device includes a first conductive layer group, a second conductive layer group, and an light emitting layer disposed between the first conductive layer group and the second conductive layer group and in ohmic contacts with the two groups. The first conductive layer group includes an electron blocking layer in ohmic contact with the light emitting layer, and a hole transport layer in ohmic contact with the electron blocking layer. The HOMO energy level of the electron blocking layer is between that of the hole transport layer and that of the light emitting layer, and the LUMO energy level of the electron blocking layer is shallower than that of the hole transport layer and that of the light emitting layer. Selecting an electron blocking layer having an appropriate HOMO energy level and LUMO energy level is able to better regulate the balance of carriers, thus prolonging the lifespan of the organic electroluminescent device and guaranteeing the product performance.

DETAILED DESCRIPTION

Figure 1:
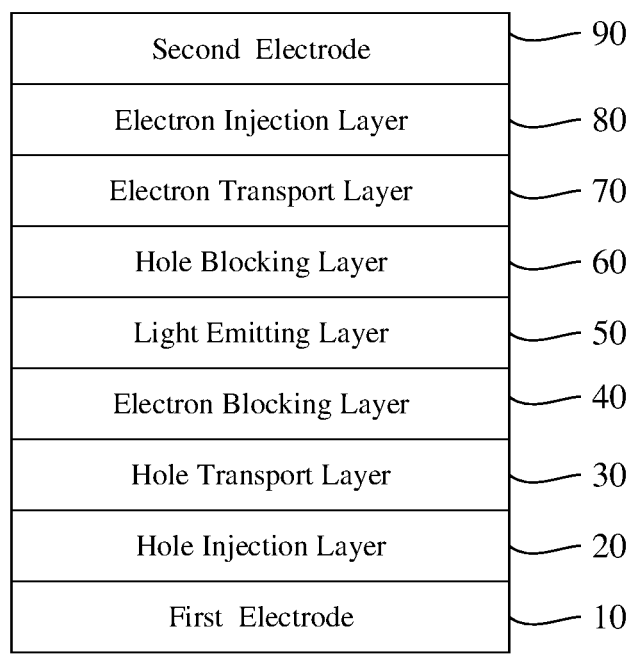
FIG. 1 is a schematic structural diagram of an organic electroluminescent device according to an embodiment of the present application.

As described above, the lifespan of the green sub-pixel light emitting layer and the blue sub-pixel light emitting layer severely affects the lifespan of the organic electroluminescent device. Therefore, it is required to prolong the lifespan of the green sub-pixel light emitting layer and the blue sub-pixel light emitting layer to prolong that of the organic electroluminescent device.

When an external voltage is exerted between an anode layer and a cathode layer and under the driven by the external voltage, holes injected from the anode layer will enter into an light emitting layer through a hole injection layer and a hole transport layer, and electrons injected from the cathode layer will enter into the light emitting layer through an electron injection layer and an electron transport layer. The holes and the electrons that have entered into the light emitting layer recombine to form excitons in a recombination region. Radiation and transition of the excitons lead to a light emission phenomenon, i.e. forming electroluminescence.

Due to different injection rates of the electrons and the holes, the numbers of the electrons and the holes injected into the recombination region of the light emitting layer are different, thus causing reduction of luminous efficiency and lifespan of the organic electroluminescent device. Especially, for the green sub-pixel light emitting layer and the blue sub-pixel light emitting layer, the lifespan is greatly shortened.

Through research, the applicant found that, if a material with an appropriate HOMO energy level and LUMO energy level is selected as an electron blocking layer, the electron injection rate and the hole injection rate are able to be better regulated, that is, the balance of carriers is able to be better regulated, thus prolonging the lifespan of the green sub-pixel light emitting layer and the blue sub-pixel light emitting layer and hence prolonging the lifespan of the organic electroluminescent device.

Through a further research, the applicant provides an organic electroluminescent device, which includes a first conductive layer group, a second conductive layer group, and a light emitting layer disposed between the first conductive layer group and the second conductive layer group and in ohmic contacts with the two groups. The first conductive layer group includes an electron blocking layer in ohmic contact with the light emitting layer, and a hole transport layer in ohmic contact with the electron blocking layer. The HOMO energy level of the electron blocking layer is between that of the hole transport layer and that of the light emitting layer, and the LUMO energy level of the electron blocking layer is shallower than that of the hole transport layer and that of the light emitting layer.

The selection of the electron blocking layer with an appropriate HOMO energy level and LUMO energy level is able to better regulating the balance of carriers, thus prolonging the lifespan of the organic electroluminescent device and guaranteeing the product performance.

It should be noted that, the occupied orbital with the highest electron energy level is called a Highest Occupied Molecular Orbital, which is abbreviated as HOMO. The unoccupied orbital with the lowest electron energy level is called a Lowest Unoccupied Molecular Orbital, which is abbreviated as LUMO. Therefore, the full name of HOMO is Highest Occupied Molecular Orbital and that of LUMO is Lowest Unoccupied Molecular Orbital. The theory of frontier molecular orbital suggests that, a "valence electron" similar to a single atom exists in a molecule, and the valence electron of the molecule is a frontier electron. Therefore, during a chemical reaction between molecules, the molecular orbitals which are first acted are the frontier orbitals, and electrons that play a key role are the frontier electrons. The HOMO of the molecule exerts a relatively loose constraint on its electrons, and has a property of an electron donor. However, the LUMO has a strong affinity for the electrons, and has a property of an electron acceptor.

To make the content of the present application clearer and easier to be understood, the present application is further described below with reference to the accompanying drawings. Definitely, the present application is not limited to the specific embodiments, and general replacements well known to those skilled in the art also fall within the protection scope of the present application.

In addition, the present application is described in detail with schematic diagrams. When illustrating the embodiment of the present application in detail, the schematic diagrams are partially enlarged without following general proportions with the purpose of facilitating the description and the present application is not limited thereto.

Referring to FIG. 1, which is a schematic structural diagram of an organic electroluminescent device provided in an embodiment of the present application. As shown in FIG. 1, the organic electroluminescent device includes a first conductive layer group, a second conductive layer group, and a light emitting layer 50 disposed between the first conductive layer group and the second conductive layer group and in ohmic contacts with the two groups. The first conductive layer group includes a first electrode 10, an electron blocking layer 40 in ohmic contact with the light emitting layer 50, a hole transport layer 30 in ohmic contact with the electron blocking layer 40, and a hole injection layer 20. That is, the first conductive layer group includes the first electrode 10, the hole injection layer 20, the hole transport layer 30, and the electron blocking layer 40, which are successively formed. The HOMO energy level of the electron blocking layer 40 is between that of the hole transport layer 30 and that of the light emitting layer 50, and the LUMO energy level of the electron blocking layer 40 is shallower than that of the hole transport layer 30 and that of the light emitting layer 50.

Preferably, the second conductive layer group includes a second electrode 90, a hole blocking layer 60 in ohmic contact with the light emitting layer 50, an electron transport layer 70 in ohmic contacts with the hole blocking layer 60, and an electron injection layer 80. That is, the second conductive layer group includes the second electrode 90, the electron injection layer 80, the electron transport layer 70, and the hole blocking layer 60 which are successively formed. Specifically, the hole blocking layer 60, the electron transport layer 70, and the electron injection layer 80 are successively formed on the light emitting layer 50.

Preferably, the first electrode 10 is an anode layer, and the second electrode 90 is a cathode layer.

The light emitting layer 50 includes a red sub-pixel light emitting layer, a green sub-pixel light emitting layer, and a blue sub-pixel light emitting layer. For the green sub-pixel light emitting layer and the blue sub-pixel light emitting layer, the electron blocking layer 40 may have different HOMO energy levels and LUMO energy levels, and may also be made of different materials, which is described below using specific embodiments.

Embodiment 1

Description is given using a blue sub-pixel light emitting layer as an example.

As described above, the electron blocking layer, the hole transport layer, the hole injection layer, and the first electrode are successively disposed below the blue sub-pixel light emitting layer; and the hole blocking layer, the electron transport layer, the electron injection layer, and the second electrode are successively disposed above the blue sub-pixel light emitting layer.

The host material of the blue sub-pixel light emitting layer is made of a fluorescent material. The fluorescent material is an electronic-type material in most cases and carriers are mainly concentrated in the interface between the hole transport layer and the light emitting layer, thereby the device lifespan being relatively short. Through the addition of the electron blocking layer with appropriate HOMO and LUMO energy levels and appropriate mobility, the injection of electrons is controlled to improve the lifespan of the blue sub-pixel light emitting layer.

Generally, the HOMO energy level of the hole transport layer ranges from 5.0 eV to 5.5 eV, and is preferably 5.2 eV; and the LUMO energy level thereof ranges from 2.0 eV to 2.3 eV, which is preferably 2.1 eV. The HOMO energy level of the host material of the blue sub-pixel light emitting layer ranges from 5.7 eV to 6.1 eV, which is preferably 6.0 eV; and the LUMO energy level thereof ranges from 2.7 eV to 3.0 eV, which is preferably 3.0 eV. The electron blocking layer added in the middle is required to be made of a material having a deep HOMO energy level which preferably ranges from 5.2 eV to 5.5 eV, such as 5.2 eV, 5.3 eV, 5.4 eV or 5.5 eV. The electron blocking layer is required to have a shallow LUMO energy level which preferably ranges from 1.9 eV to 2.1 eV, such as 1.9 eV, 2.0 eV, or 2.1 eV. Moreover, for the material of the electron blocking layer, the energy level difference Eg between HOMO energy level and LUMO energy level is required to be large, which is preferably greater than 3.2 eV, thus facilitating hole injection and electron blocking. However, the material with a deep HOMO energy level usually has low mobility. In consideration of the device voltage, the electron blocking layer preferably has a thickness of from 50 Å to 100 Å, so as to obtain a low power consumption product. For example, the electron blocking layer has a thickness of 50 Å, 60 Å, 70 Å, 80 Å, 90 Å or 100 Å.

The material of the electron blocking layer is preferably a material having a structure of a single aromatic amine containing spirofluorene groups, and the primary structural formula thereof may be one or more selected from the group consisting of:

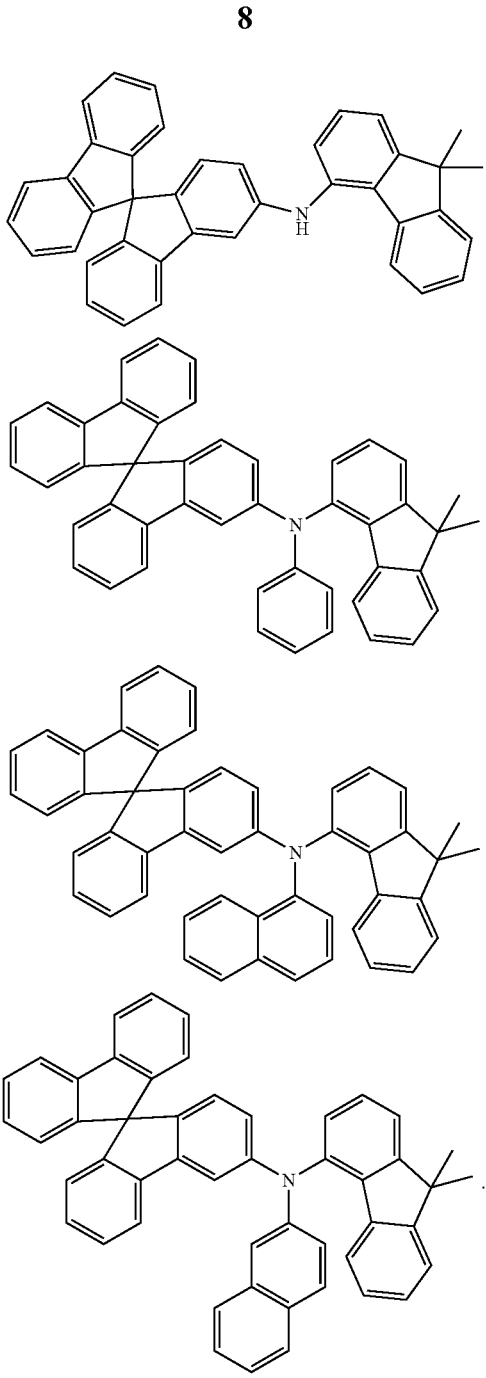

Figure 2:
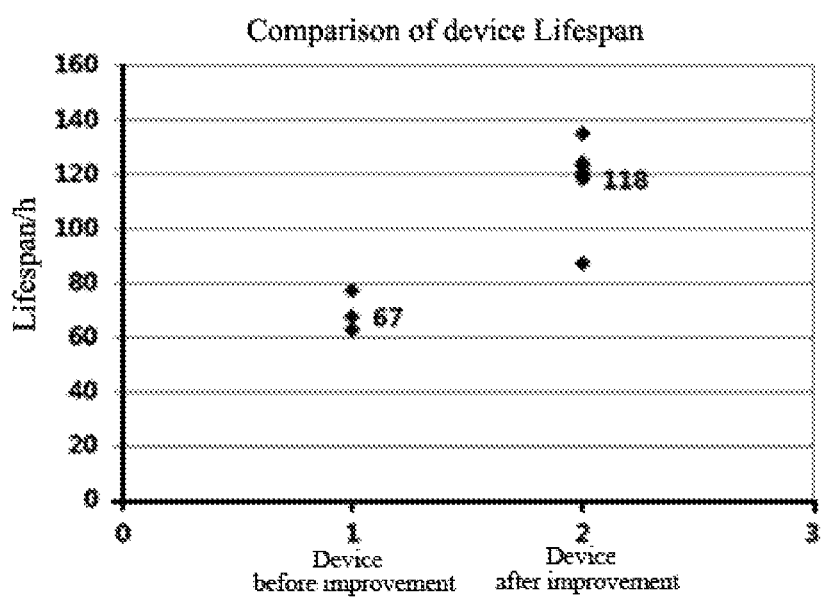
FIG. 2 is a lifespan comparison diagram of an organic electroluminescent device according to Embodiment 1 of the present application.

It is demonstrated through experiments that, when the electron blocking layer located below the blue sub-pixel light emitting layer is made of a material having a structure of a single aromatic amine containing spirofluorene groups, and the HOMO energy level of the material of the electron blocking layer preferably ranges from 5.2 eV to 5.5 eV with the LUMO energy level thereof preferably ranging from 1.9 eV to 2.1 eV, the lifespan of the organic electroluminescent device is obviously improved. FIG. 2 shows a specific effect of the lifespan improvement, where the abscissa indicates a device before and after improvement and the ordinate indicates the lifespan (unit: h). It can be seen from FIG. 2 that, the average lifespan of the device before improvement is around 67 h, and the average lifespan of the device after improvement is around 118 h. Thus, the device lifespan is prolonged by 40%.

Embodiment 2

Description is given using a green sub-pixel light emitting layer as an example.

As described above, the electron blocking layer, the hole transport layer, the hole injection layer, and the first electrode are successively disposed below the green sub-pixel light emitting layer; and the hole blocking layer, the electron transport layer, the electron injection layer, and the second electrode are successively disposed above the green sub-pixel light emitting layer.

The green sub-pixel light emitting layer is mainly made of a bipolar phosphorescent material which has equivalent holes and electrons. The carrier recombination region is relatively wide and far away from the hole transport layer. Through adding the electron blocking layer made of a material having appropriate HOMO energy level and LUMO energy level and appropriate mobility, the balance of hole carriers is controlled to improve the lifespan of the green sub-pixel light emitting layer.

Generally, the HOMO energy level of the hole transport layer ranges from 5.0 eV to 5.5 eV, which is preferably 5.2 eV; and the LUMO energy level thereof ranges from 2.0 eV to 2.3 eV, which is preferably 2.1 eV. The HOMO energy level of the host material of the green sub-pixel light emitting layer ranges from 5.3 eV to 5.6 eV, which is preferably 5.5 eV; and the LUMO energy level thereof ranges from 2.1 eV to 2.5 eV, which is preferably 2.0 eV. The HOMO energy level of the material of the electron blocking layer added in the middle is required to be deep, which preferably ranges from 5.2 eV to 5.5 eV, such as 5.2 eV, 5.3 eV, 5.4 eV or 5.5 eV. The LUMO energy level of the material of the electron blocking layer is further required to be shallow, which preferably ranges from 1.8 eV to 2.0 eV, such as 1.8 eV, 1.9 eV, or 2.0 eV. Moreover, for the material of the electron blocking layer, the energy level difference Eg between the HOMO energy level and the LUMO energy level is required to be large, which is preferably greater than 3.2 eV, thus facilitating hole injection and electron blocking. Due to the quenching of triple state existed in the system of phosphorescent materials, the energy level of triple state T1 for the material of the hole blocking layer is required to be greater than 2.6 eV. At the same time, the material with a deep HOMO energy level has low mobility. In consideration of the device voltage, the electron blocking layer preferably has a thickness of 100 Å to 400 Å to obtain a low power consumption product. For example, the electron blocking layer has a thickness of 100 Å, 200 Å, 300 Å or 400 Å. The hole blocking layer preferably has a thickness of 50 Å to 100 Å. For example, the hole blocking layer has a thickness of 50 Å, 60 Å, 70 Å, 80 Å, 90 Å or 100 Å.

The material of the electron blocking layer is preferably made of a material having a structure of a single aromatic amine containing spirocyclic units, and the primary structural formula thereof is one or more selected from the group consisting of:

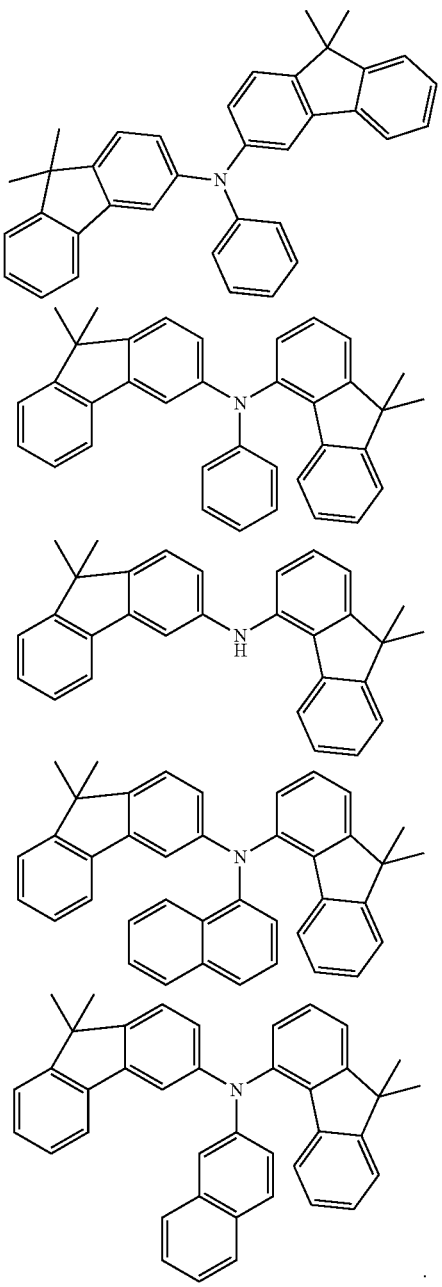

Figure 3:
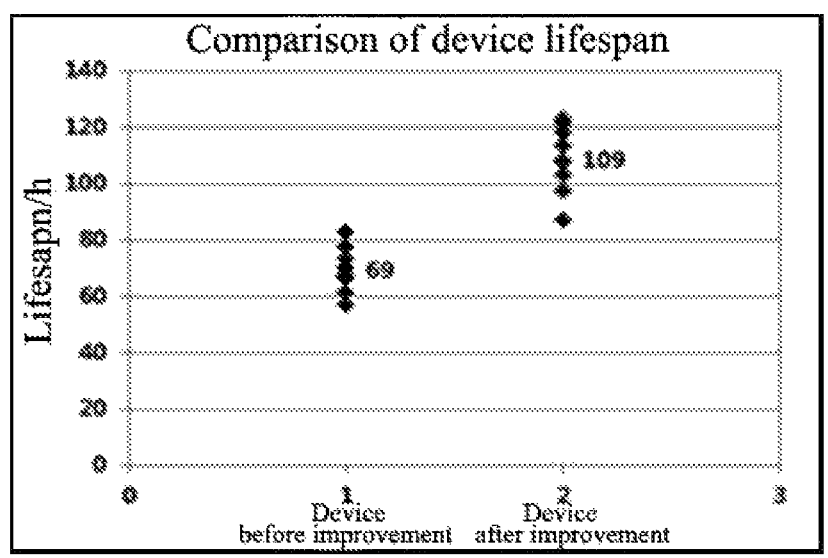
FIG. 3 is a lifespan comparison diagram of an organic electroluminescent device according to Embodiment 2 of the present application.

It is demonstrated through experiments that, when the electron blocking layer located below the green sub-pixel light emitting layer is made of a material having a structure of a single aromatic amine containing spirocyclic units, and the HOMO energy level of the material of the electron blocking layer preferably ranges from 5.2 eV to 5.5 eV with the LUMO energy level thereof preferably ranging from 1.8 eV to 2.0 eV, the lifespan of the organic electroluminescent device is obviously improved. FIG. 3 shows a specific effect of the lifespan improvement, where the abscissa indicates a device before and after improvement, and the ordinate indicates the lifespan (unit: h). It can be seen from FIG. 3 that, the average lifespan of the device before improvement is around 69 h, and the average lifespan of the device after improvement is around 109 h. Thus, the device lifespan is prolonged by 35%.

It should be noted that, the verification of foregoing two embodiments are carried out simultaneously. That is, the electron blocking layers located below the blue sub-pixel light emitting layer and located below the green sub-pixel light emitting layer are improved at the same time, to verify the device lifespan. The lifespan of the organic electroluminescent device is prolonged at least 35%.

Accordingly, the present application also provides a display apparatus comprising a substrate and the above-described organic electroluminescent device formed on the substrate.

Specifically, the display apparatus includes a first electrode, a hole injection layer, a hole transport layer, an electron blocking layer, a light emitting layer, a hole blocking layer, an electron transport layer, an electron injection layer, and a second electrode, which are successively disposed on the substrate. The HOMO energy level of the electron blocking layer is between that of the hole transport layer and that of the light emitting layer, and the LUMO energy level of the electron blocking layer is shallower than that of the hole transport layer and that of the light emitting layer.

Further, the light emitting layer includes a red sub-pixel light emitting layer, a green sub-pixel light emitting layer, and a blue sub-pixel light emitting layer. The HOMO energy level of the electron blocking layer below the blue sub-pixel light emitting layer ranges from 5.2 eV to 5.5 eV, and the LUMO energy level thereof ranges from 1.9 eV to 2.1 eV. An energy level difference between the HOMO energy level and the LUMO energy level of the electron blocking layer is greater than 3.2 eV, and the electron blocking layer is preferably made of a material having a structure of a single aromatic amine containing spirofluorene groups. The HOMO energy level of the electron blocking layer below the green sub-pixel light emitting layer ranges from 5.2 eV to 5.5 eV, and the LUMO energy level thereof ranges from 1.8 eV to 2.0 eV. An energy level difference between the HOMO energy level and the LUMO energy level of the electron blocking layer is greater than 3.2 eV, and the electron blocking layer is preferably made of a material having a structure of a single aromatic amine containing spirocyclic units.

Further, the electron blocking layer below the blue sub-pixel light emitting layer preferably has a thickness of 50 Å to 100 Å. The electron blocking layer below the green sub-pixel light emitting layer preferably has a thickness of 100 Å to 400 Å, and the hole blocking layer above the green sub-pixel light emitting layer preferably has a thickness of 50 Å to 100 Å.

In conclusion, in the organic electroluminescent device and the display apparatus provided by the present application, the organic electroluminescent device includes a first conductive layer group, a second conductive layer group, and a light emitting layer located between the first conductive layer group and the second conductive layer group and in ohmic contacts with the two groups. The first conductive layer group includes an electron blocking layer in ohmic contact with the light emitting layer, and a hole transport layer in ohmic contact with the electron blocking layer. The HOMO energy level of the electron blocking layer is between that of the hole transport layer and that of the light emitting layer, and the LUMO energy level of the electron blocking layer is shallower than that of the hole transport layer and that of the light emitting layer. Selecting an electron blocking layer having an appropriate HOMO energy level and LUMO energy level is able to better regulate the balance of carriers, thus prolonging the lifespan of the organic electroluminescent device and guaranteeing the product performance.

The above descriptions are merely preferred embodiments of the present application, and are not intended to limit the scope of the present application. All changes and modifications made by those of ordinary skilled in the art according to the disclosure should fall within the scope of the appended claims present application.

What is claimed is:

1. An organic electroluminescent device, comprising:
a first conductive layer group,
a second conductive layer group, and
a blue sub-pixel light emitting layer disposed between the first conductive layer group and the second conductive layer group and in ohmic contact with the two groups,
wherein the first conductive layer group comprises an electron blocking layer in ohmic contact with the light emitting layer and a hole transport layer in ohmic contact with the electron blocking layer,
wherein a HOMO energy level of the electron blocking layer is between a HOMO energy level of the hole transport layer and a HOMO energy level of the light emitting layer, and a LUMO energy level of the electron blocking layer is shallower than a LUMO energy level of the hole transport layer and a LUMO energy level of the light emitting layer,
wherein an energy level difference for the hole transport layer ranges from 2.7 eV to 3.5 eV, an energy level difference for the host material of the blue sub-pixel light emitting layer ranges from 2.7 eV to 3.4 eV, the HOMO energy level of the electron blocking layer below the blue sub-pixel light emitting layer ranging from 5.2 eV to 5.5 eV, the LUMO energy level of the electron blocking layer below the blue sub-pixel light emitting layer ranging from 1.9 eV to 2.1 eV, wherein an energy level difference between the HOMO energy level and the LUMO energy level of the electron blocking layer below the blue sub-pixel light emitting layer is greater than 3.2 eV, wherein the blue sub-pixel light emitting layer is made of a fluorescent material, and the electron blocking layer located below the blue sub-pixel light emitting layer is made of a material having a structure of a single aromatic amine containing a spirofluorene group and has a thickness of 50 Å to 100 Å.

2. The organic electroluminescent device of claim 1, wherein the HOMO energy level of the hole transport layer is equal to or shallower than the HOMO energy level of the light emitting layer, and the LUMO level of the hole transport layer is equal to or shallower than the LUMO level of the light emitting layer.

3. The organic electroluminescent device of claim 1, wherein a structural formula of the structure of a single aromatic amine is one or more selected from the group consisting of:

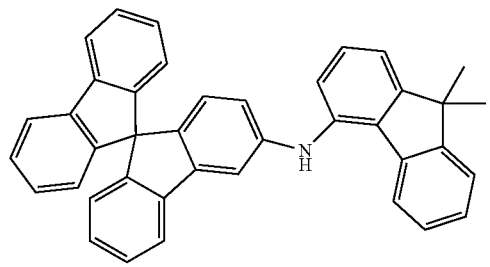

-continued

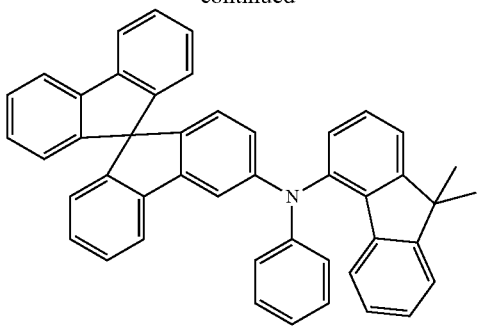

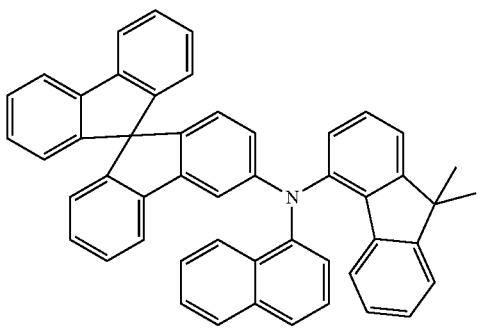

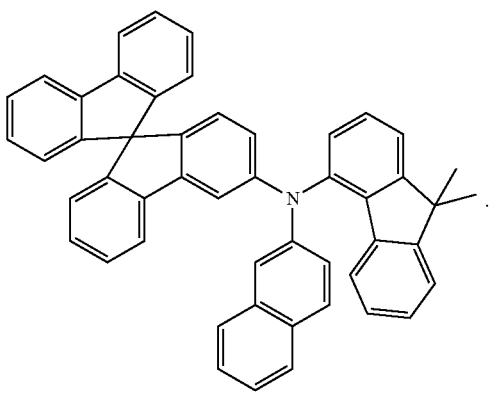

4. A display apparatus, comprising a substrate and an organic electroluminescent device of claim 1 formed on the substrate.

5. The organic electroluminescent device of claim 1, wherein the first conductive layer group further comprises a first electrode, a hole injection layer, a hole transport layer, and an electron blocking layer which are successively formed.

6. The organic electroluminescent device of claim 1, wherein the second conductive layer group comprises a second electrode, an electron injection layer, an electron transport layer, and a hole blocking layer which are successively formed.

7. The organic electroluminescent device of claim 1, wherein the first electrode is an anode layer.

8. The organic electroluminescent device of claim 2, wherein the second electrode is a cathode layer.

9. The organic electroluminescent device of claim 1, wherein a HOMO energy level of the hole transport layer ranges from 5.0 eV to 5.5 eV, and a LUMO energy level of the hole transport layer ranges from 2.0 eV to 2.3 eV.

10. The organic electroluminescent device of claim 1, wherein a HOMO energy level of the host material of the blue sub-pixel light emitting layer ranges from 5.7 eV to 6.1 eV, and a LUMO energy level of the host material of the blue sub-pixel light emitting layer ranges from 2.7 eV to 3.0 eV.

11. An organic electroluminescent device, comprising:
a first conductive layer group,
a second conductive layer group, and
a green sub-pixel light emitting layer disposed between the first conductive layer group and the second conductive layer group and in ohmic contact with the two groups,
wherein the first conductive layer group comprises an electron blocking layer in ohmic contact with the light emitting layer and a hole transport layer in ohmic contact with the electron blocking layer,
wherein a HOMO energy level of the electron blocking layer is between a HOMO energy level of the hole transport layer and a HOMO energy level of the light emitting layer, and a LUMO energy level of the electron blocking layer is shallower than a LUMO energy level of the hole transport layer and a LUMO energy level of the light emitting layer,
wherein an energy level difference for the hole transport layer ranges from 2.7 eV to 3.5 eV, an energy level difference for the host material of the green sub-pixel light emitting layer ranges from 2.8 eV to 3.5 eV, the HOMO energy level of the electron blocking layer below the green sub-pixel light emitting layer ranges from 5.2 eV to 5.5 eV, the LUMO energy level of the electron blocking layer below the green sub-pixel light emitting layer ranges from 1.8 eV to 2.0 eV, and an energy level difference between the HOMO energy level and the LUMO energy level of the electron blocking layer below the green sub-pixel light emitting layer is greater than 3.2 eV,
wherein the green sub-pixel light emitting layer is made of a bipolar phosphorescent material, and the electron blocking layer located below the green sub-pixel light emitting layer is made of a material having a structure of a single aromatic amine containing a spirocyclic unit and has a thickness of 100 Å to 400 Å.

12. The organic electroluminescent device of claim 11, wherein a structural formula of the structure of a single aromatic amine is one or more selected from the group consisting of:

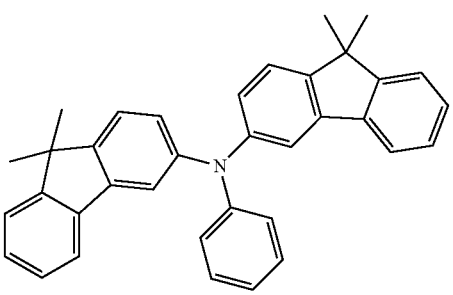

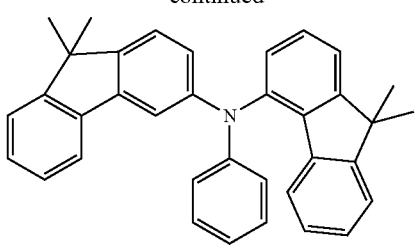

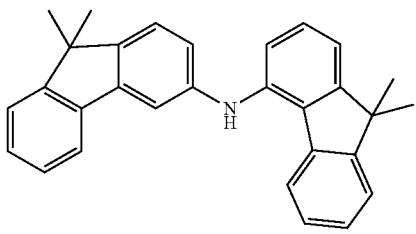

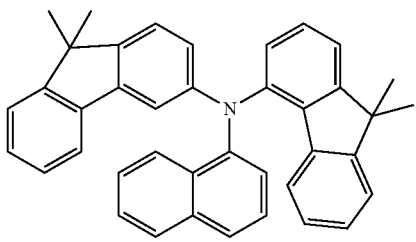

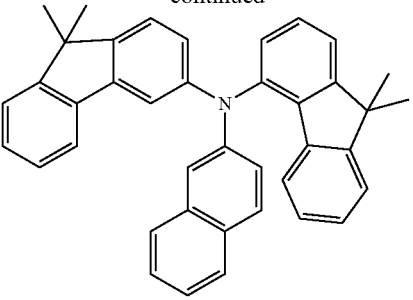

13. The organic electroluminescent device of claim 11, wherein a hole blocking layer located above the green sub-pixel light emitting layer in the second conductive layer group has a thickness of 50 Å to 100 Å.

14. A display apparatus, comprising a substrate and an organic electroluminescent device of claim 11 formed on the substrate.

15. The organic electroluminescent device of claim 11, wherein a HOMO energy level of the hole transport layer ranges from 5.0 eV to 5.5 eV, and a LUMO energy level of the hole transport layer ranges from 2.0 eV to 2.3 eV.

16. The organic electroluminescent device of claim 11, wherein a HOMO energy level of the host material of the green sub-pixel light emitting layer ranges from 5.3 eV to 5.6 eV, and a LUMO energy level of the host material of the green sub-pixel light emitting layer ranges from 2.1 eV to 2.5 eV.

17. The organic electroluminescent device of claim 13, wherein an energy level of triple state for a material of the hole blocking layer is greater than 2.6 eV.

* * * * *